(12) United States Patent
Fenigstein

(10) Patent No.: US 11,592,584 B1
(45) Date of Patent: Feb. 28, 2023

(54) WAVELENGTH SELECTIVE RADIATION SENSOR

(71) Applicant: Tower Semiconductor Ltd., Migdal Haemek (IL)

(72) Inventor: Amos Fenigstein, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 17/444,562

(22) Filed: Aug. 5, 2021

(51) Int. Cl.
*G01T 1/24* (2006.01)
*H01L 27/144* (2006.01)

(52) U.S. Cl.
CPC .......... *G01T 1/247* (2013.01); *H01L 27/1443* (2013.01)

(58) Field of Classification Search
CPC ............. H01L 33/0016; H01L 33/0008; H01L 33/0004; H01L 31/10; H01L 31/101; H01L 27/14; H01L 27/144; H01L 27/1443; G01T 1/24; G01T 1/247
See application file for complete search history.

(56) References Cited

U.S. PATENT DOCUMENTS

2022/0026266 A1* 1/2022 Evgeny ................... G01J 1/429

\* cited by examiner

*Primary Examiner* — John R Lee
(74) *Attorney, Agent, or Firm* — Reches Patents

(57) ABSTRACT

There may be provided a radiation sensor, that may include multiple semiconductor regions that form a sensing PN junction and a draining PN junction that is located below the sensing PN junction; a bias circuit that is configured to (i) bias the sensing PN junction to maintain a sensing PN junction depletion region of a fixed size during a first sensing period and during a second sensing period, and (i) bias the draining PN junction to form a draining PN junction depletion region of a first size during the first sensing period and of a second size during the second sensing period; and an output circuit that is configured to generate a first output signal that represent sensed radiation out of radiation that impinged on the radiation sensor during the first sensing period, and to generate a second output signal that represent sensed radiation out of radiation impinged on the radiation sensor during the second sensing period.

16 Claims, 7 Drawing Sheets

Vramp = Vramp1

Vramp = Vramp2

Vramp = Vramp1

Vramp = Vramp2

WAVELENGTH SELECTIVE RADIATION SENSOR

BACKGROUND OF THE INVENTION

Ultraviolet (UV) sensors are used for measuring UV light intensity, and for analyzing the power in three different UV bands—UVA, UVB and UVC. UVA rays have the shortest wavelength, followed by UVB and UVC.

Silicon sensors have small response in the UV, mainly because of UV blocking layers (nitride layers in the Back-end) and due to very shallow absorption depth.

Silicon sensors have much stronger absorption in the visible light range. Furthermore, most of the power of sunlight is in the visible wavelength range Visible-blind sensor may be provided, for instance GaN sensors, however, those are very expensive and still fail to properly analyze the composition of the UV radiation—especially separate between UVA, UVB and UVC.

There is a growing need to provide a radiation sensor that is radiation selective.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
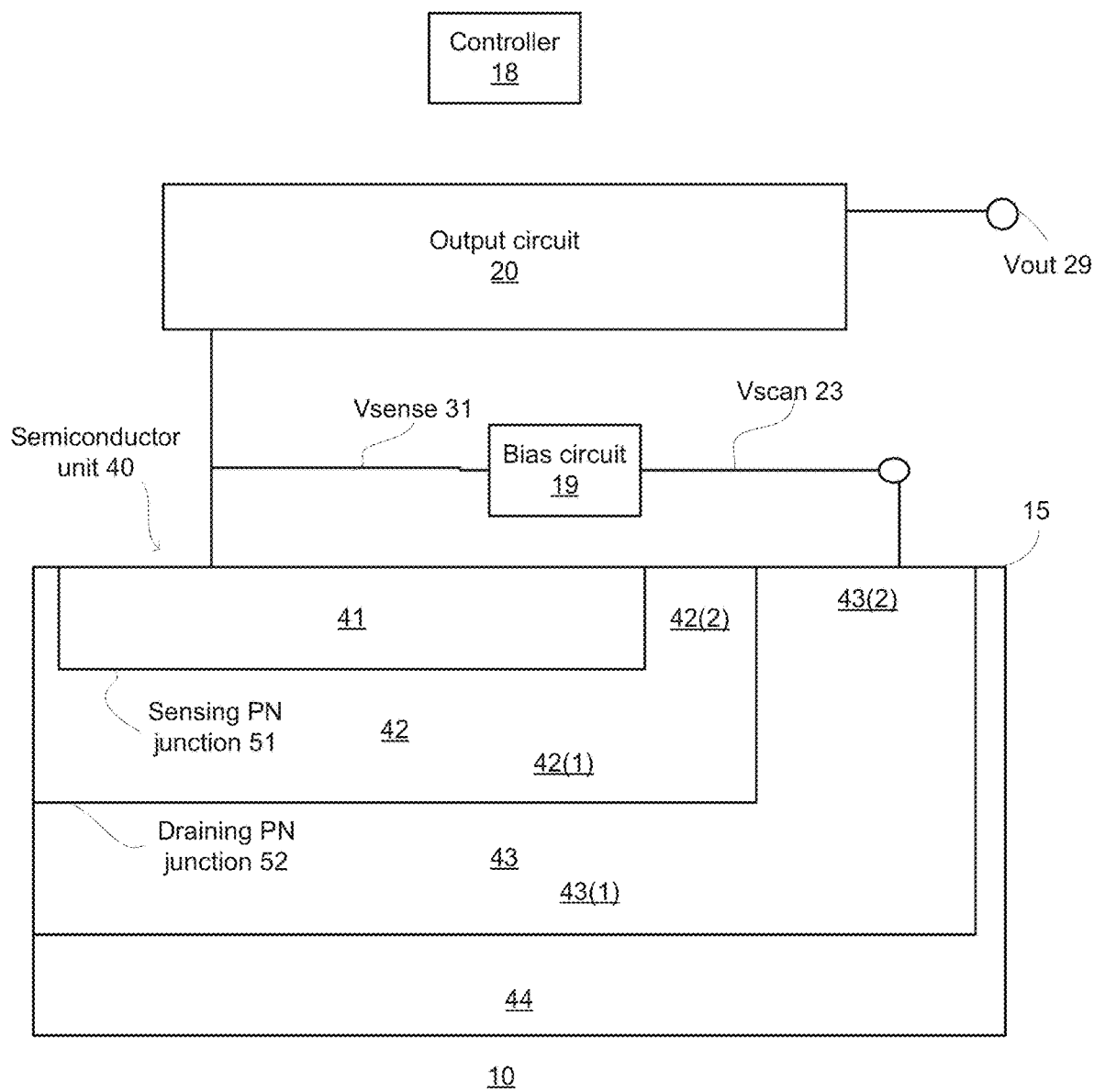
FIG. 1 is an example of a radiation sensor.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DESCRIPTION OF THE PREFERRED EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

FIG. 1 illustrates an example of a radiation sensor 10 that includes multiple semiconductor regions 41, 42, 43 and 44, a bias circuit 19, controller 18, and output circuit 20. Controller 18 may control the bias circuit 19 and the output circuit 20.

Multiple radiation sensors may be provided—and may share their controller 18 and their bias circuit 19.

The multiple semiconductor regions form a sensing PN junction 51 and a draining PN junction 52. The draining PN junction 52 is located below the sensing PN junction 51.

The multiple semiconductor regions may include, for example, a first semiconductor region 41 of an N-type, a second semiconductor region 42 of a P-type, and a third semiconductor region 43 of an N-type. Alternatively—the multiple semiconductor regions may include, for example, a first semiconductor region of a P-type, a second semiconductor region of an N-type, and a third semiconductor region of a P-type.

In both cases—the sensing PN junction 45 is formed between the first semiconductor region 41 and the second semiconductor region 42. The draining PN junction 52 is formed between the second semiconductor region 42 and the third semiconductor region 43. The third semiconductor region 43 may be located above substrate 44 or any other part of semiconductor unit 40.

The bias circuit 19 is configured to bias the sensing PN junction to form a sensing PN junction depletion region of a fixed size during multiple sensing periods—for example during a first sensing period and during a second sensing period. This may be obtained by providing a fixed value Vsense 31 during the multiple sensing periods. Vsense may be provided to the first semiconductor region. The first semiconductor region may also be in communication with the output circuit 20 and may feed the output circuit 20 with current indicative of radiation.

The bias circuit 19 is also configured to bias the draining PN junction to form a draining PN junction depletion region of different sizes during multiple sensing periods (while maintaining the same size during a single sensing period). For example—the bias circuit 19 may bias the draining PN junction to have a draining PN junction depletion region of a first size during the first sensing period and to have a draining PN junction depletion region of a second size during the second sensing period, the first size differ from the second size. Vscan 23 may be provided to the third semiconductor region 43.

The first semiconductor region may have a top surface located within a certain plane 15. [Amos]—I'm not sure what his plane refers to, and I cant find plane 15 in the drawings A first portion 42(1) of the second semiconductor region may be located below the first semiconductor region 41. A second portion 42(2) of the second semiconductor region may reach the certain plane 15. The first portion 42(1) of the second semiconductor region may be parallel to the certain plane and be positioned directly below the first semiconductor region. The second semiconductor region may at least partially surround the first semiconductor region.

A first portion 43(1) of the third semiconductor region may be located below the second semiconductor region 42—or at least below the first portion 42(1) of the second semiconductor region. A second portion 43(2) of the third semiconductor region may reach the certain plane 15. The first portion of the third semiconductor region may be parallel to the certain plane and be positioned directly below the first portion of the second semiconductor region. The third semiconductor region may at least partially surround the second semiconductor region.

Figure 2:
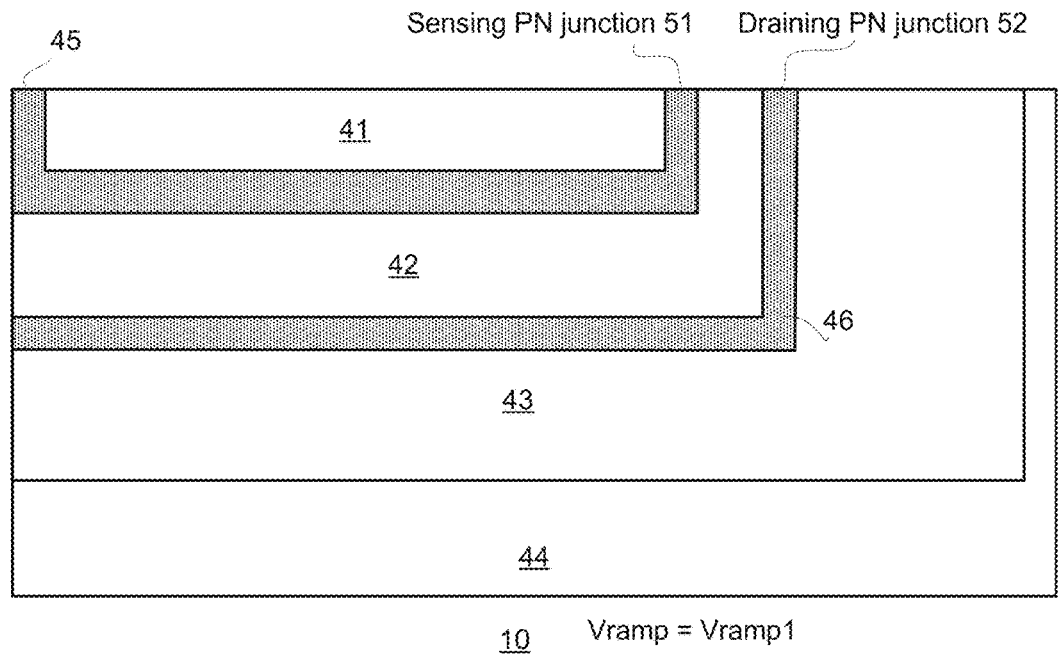
FIG. 2 is an example of a radiation sensor.
Figure 2:
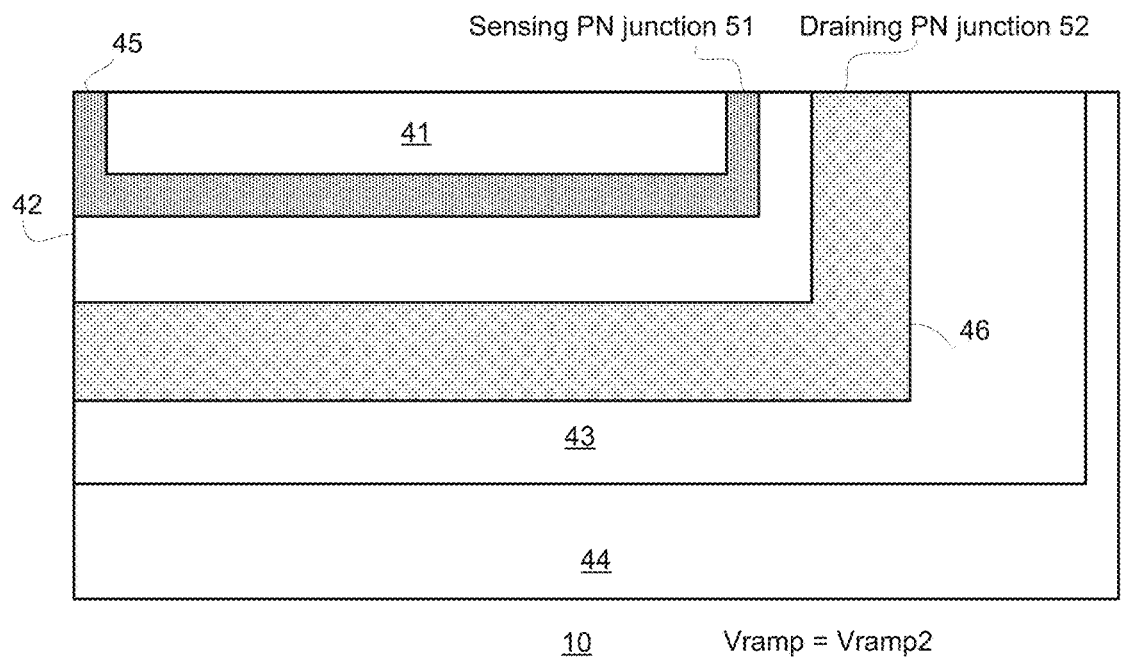

FIG. 2 illustrates examples of depletion regions formed in the semiconductor unit during a first sensing period (Vramp has a first value Vramp1), and the depletion regions formed in the semiconductor unit during a second sensing period (Vramp has a second value Vramp2). Vramp2 exceeds Vramp1.

Because Vsense remains the same—the size of sensing PN junction depletion region 45 remains the same. Because Vramp2 exceeds Vramp1 the draining PN junction depletion region 46 of the first sensing period is smaller than the draining PN junction depletion region 46 during the second sensing period.

Radiation of different wavelengths exhibit different penetration depths within the semiconductor unit 40—and accordingly result in the formation of photogenerated carriers at different depths (distance from the certain region 15) within the semiconductor unit 40.

Any photogenerated carrier formed within the semiconductor unit may be a sensed photogenerated carrier or a drained photogenerated carrier. Sensed photogenerated carriers reach the first semiconductor region and be sensed by the output circuit. Drained photogenerated carriers do not reach the first semiconductor region.

Sensed photogenerated carriers may be formed within the sensing PN junction depletion region 45. Drained photogenerated carriers may be formed within the draining PN junction depletion region 46.

Photogenerated carriers that are formed between the sensing PN junction depletion region 45 and the draining PN junction depletion region 46 may be distributed to provide some sensed photogenerated carriers and some drained photogenerated carriers. The distribution depends, at least, on the location of the photogenerated carriers from each of the depletion regions.

Figure 3:
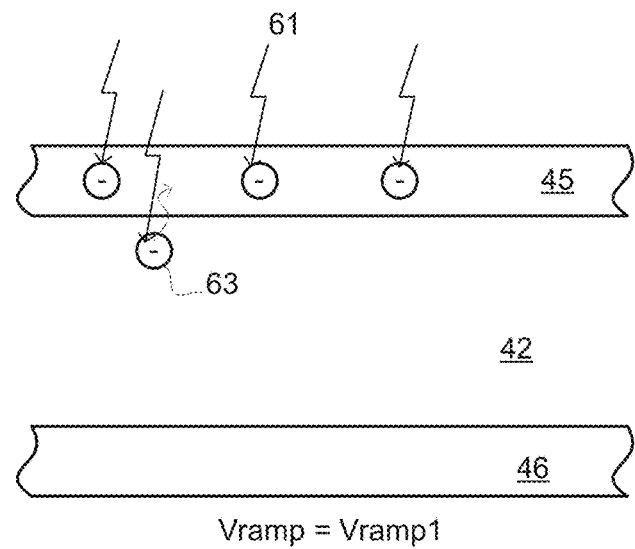
FIGS. 3 and 4 illustrate examples of distribution of photogenerated carriers.
Figure 3:
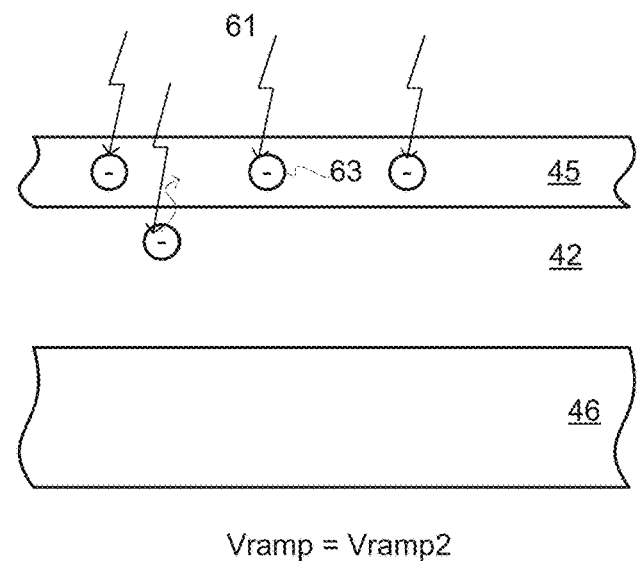
Figure 4:
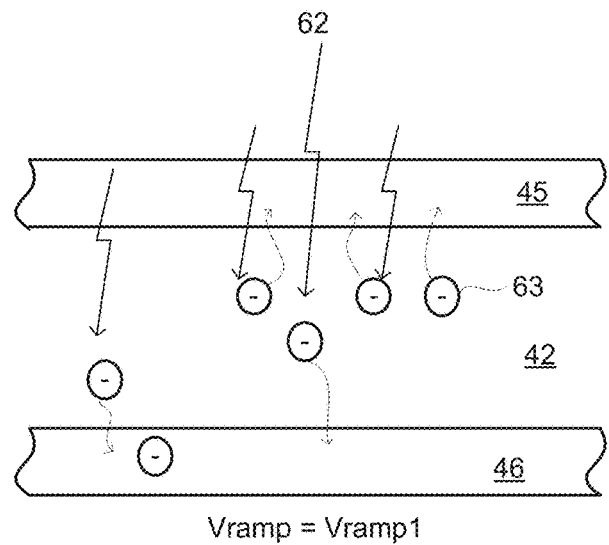
Figure 4:
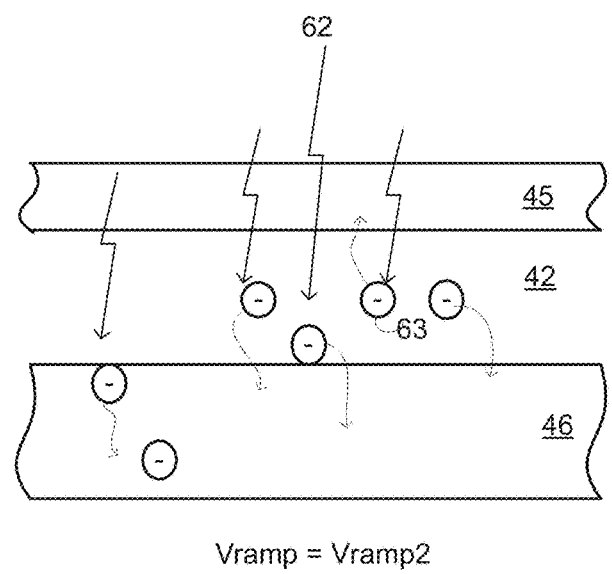

FIGS. 3 and 4 illustrate examples of distributions of photogenerated carriers 63 between the sensing PN junction depletion region 45 and the draining PN junction depletion region 46—at two different values of Vramp and under different illumination conditions. FIG. 3 illustrates a distribution when illuminating the semiconductor unit with first wavelength radiation 61. FIG. 3 illustrates a distribution when illuminating the semiconductor unit with second wavelength radiation 62.

The semiconductor unit may be fabricated to correspond with the penetration depth of radiation:

a. Have a structure and size (for example a structure and size of the first semiconductor region) that corresponds to the penetration depth of a first wavelength radiation—so that most or all of the photogenerated carriers that are generated due to the first wavelength radiation to reach the first semiconductor region and not reach the draining PN junction.

b. Have a structure and size (for example a structure and size of the third semiconductor region) that corresponds to the penetration depth of a second wavelength radiation—so that most or all of the photogenerated carriers that are generated due to the second wavelength radiation to reach the third semiconductor region and reach the draining PN junction.

The first wavelength radiation may be of more significance than the second wavelength radiation—but this is not necessarily so. The second wavelength radiation may be insignificant—and may be filtered out. For example—be visible light radiation—when trying to sense ultraviolet radiation.

The mentioned above radiation sensor may exhibit a sensitivity to first wavelength radiation that is a function of a size of the sensing PN junction depletion region, and may exhibit a sensitivity to second wavelength radiation that is a function of a size of the draining PN junction depletion region.

Maintaining a fixed size of sensing PN junction depletion region while changing the size of the draining PN junction depletion region allows to distinguish between the first wavelength radiation and the second wavelength radiation.

The sensing unit may be operated by having multiple sensing period in which different Vramp value are applied and the same Vsense is applied—thereby providing multiple measurements that may be analyzed in order to distinguish between multiple spectral components (of different wavelengths) of impinging radiation. Increasing the absolute value of Vramp may cut more portions of the longer wavelength radiation.

By controlling the depth of the depletion regions by biasing—the measurements may be less dependent to (and even ignorant of) process variations. Additionally or alternatively—a mapping between radiation properties (intensity and wavelength) and process variation may be obtained (generated or received) and may be used to compensate for process variations. The mapping may include illuminating with radiation of known properties (intensity and radiation) of sensing units of different process flavors.

The first wavelength and the second wavelength may be any pair of different wavelengths—for example two different ultraviolet wavelengths, visual light and ultraviolet radiation, two non-ultraviolet radiations, and the like.

Figure 5:
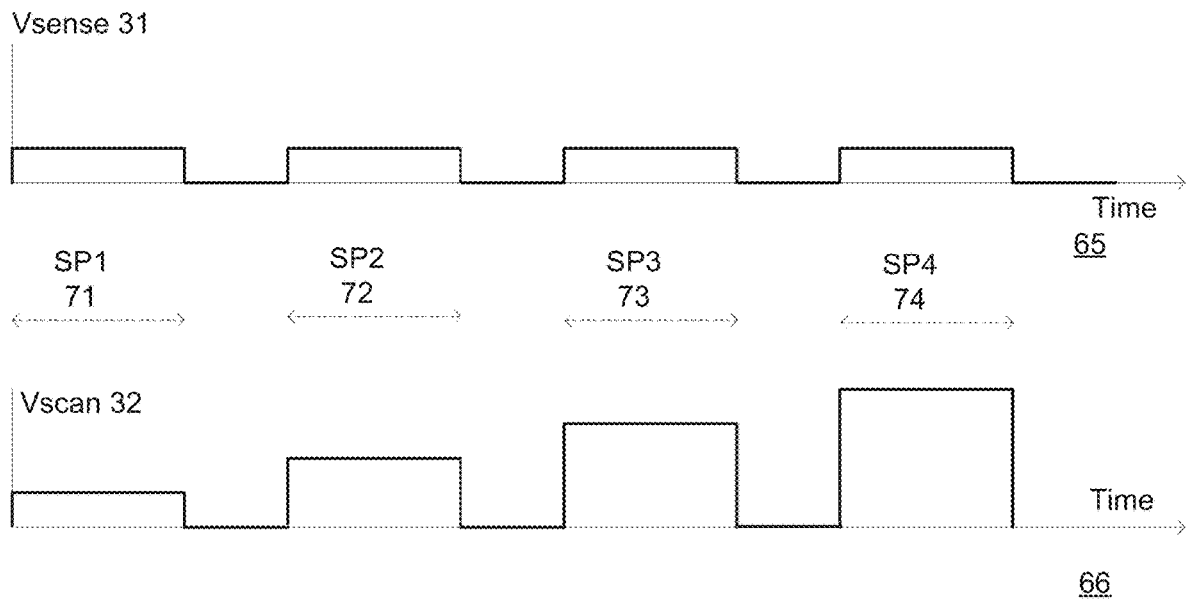
FIG. 5 illustrates example of timing diagrams.

FIG. 5 illustrates timing diagrams 65 and 66.

Timing diagram 65 illustrates the value of Vsense 31—which is the same during first to fourth (SP1-SP4) sensing periods 71-74.

Timing diagram 66 illustrates the value of Vscan 32—which changes between the first to fourth (SP1-SP4) sensing periods 71-74.

Figure 6:
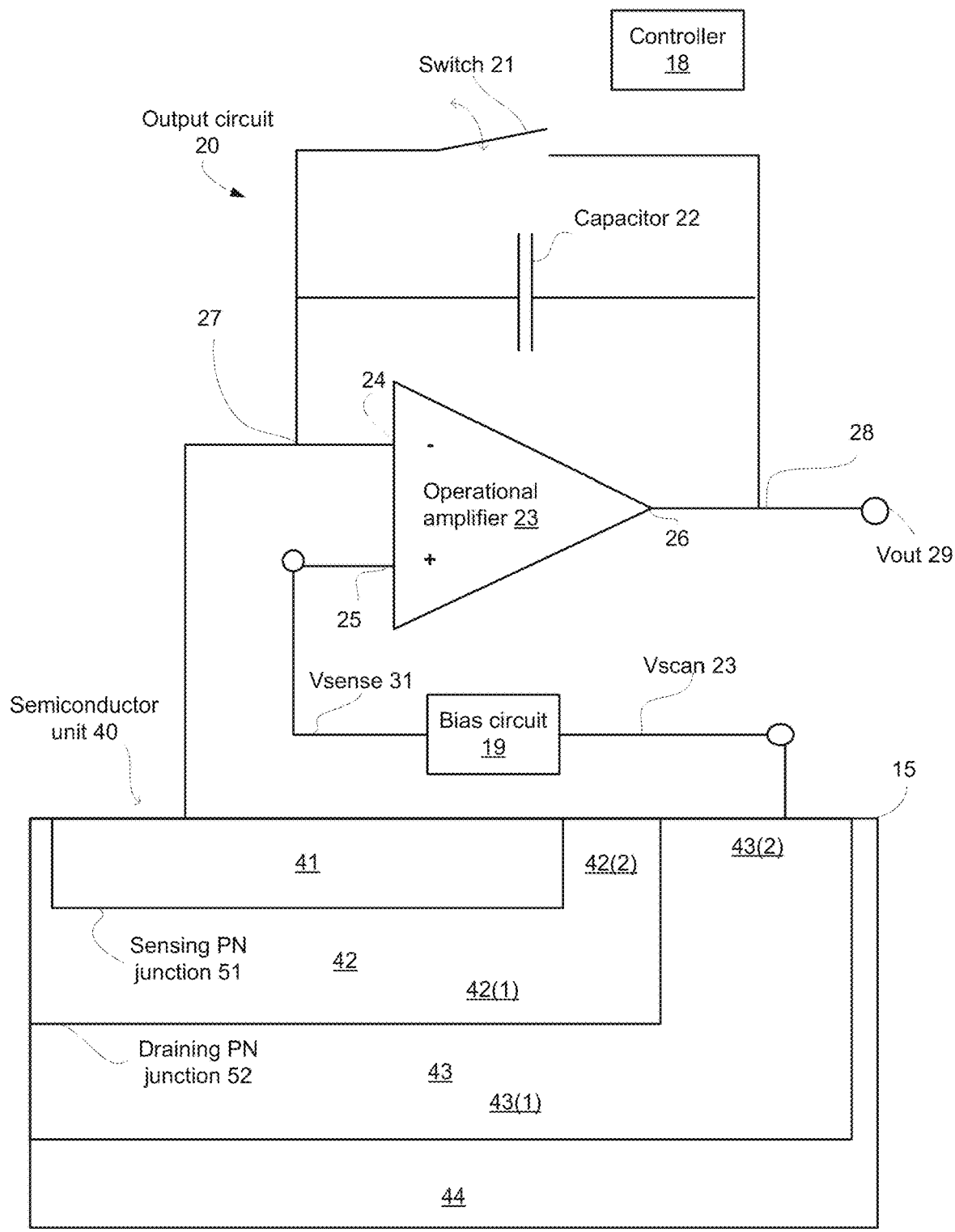
FIG. 6 is an example of a radiation sensor.

FIG. 6 illustrates an example of a radiation sensor 10 that includes multiple semiconductor regions 41, 42, 43 and 44, a bias circuit 19, controller 18, and output circuit 20.

The output circuit 10 is illustrated being a capacitive transimpedance amplifier that includes input node 27, output node 28, operational amplifier 23, switch 21 and capacitor 22. Operational amplifier 23 includes a non-inverting input port 25, an inverting input port 24 and an output port 26.

The capacitor 22 and the switch 21 are coupled between an input node 27 and the output node 28. The input node is also connected to the inverting input port 24. The output node 28 is also connected to the output port 26.

The non-inverting input port 25 is biased with a fixed bias signal Vsense 31. The inverting input port 24 is also coupled to first semiconductor region 41. Due to the virtual ground between the non-inverting input port 25 and the inverting input port 24—the first semiconductor region 41 is fed with Vsense 31. The output port 26 is connected to output node 28 that provides output signal Vout 28.

Assuming that the photogenerated carriers are electrons—during a sensing period switch 21 is open and current generated by sensed photogenerated carriers charge capacitor 22. The sensing period may also be referred to as an integration period.

When the sensing period ends the voltage on capacitor 22 reflects the current that charged the capacitor 22.

At the end of the sensing period the switch closes and the capacitor is discharged.

Figure 7:
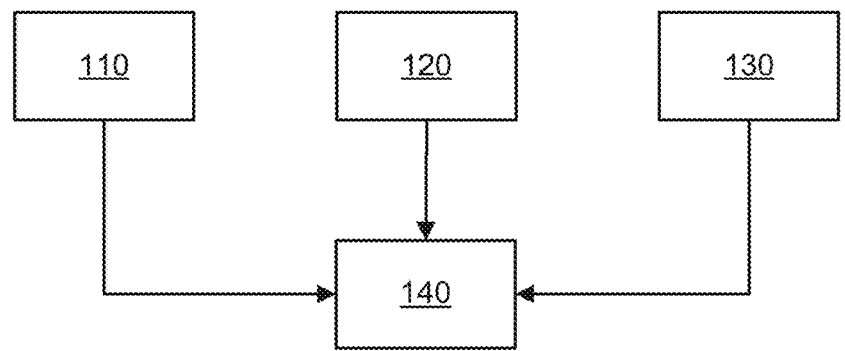
FIG. 7 is an example of a method.

FIG. 7 illustrates an example of method 100.

FIG. 100 may start by steps 110, 120 and 130.

Step 110 may include receiving radiation sensor during multiple sensing periods. The radiation sensor may include (a) multiple semiconductor regions that form a sensing PN junction and a draining PN junction that is located below the sensing PN junction, (b) a biasing circuit, and an output circuit.

Step 120 may include biasing, by the bias circuit and during the multiple sensing periods, the sensing PN junction to maintain a sensing PN junction depletion region of a fixed size during each sensing period. The biasing may include changing a biasing between one sensing period to another sensing period.

Steps 110 and 120 may be followed by step 130 of generating, by the output circuit, multiple output signals indicative of radiation received during the multiple sensing periods.

Any reference to any of the terms "comprise", "comprises", "comprising" "including", "may include" and "includes" may be applied to any of the terms "consists", "consisting", "consisting essentially of". For example—any of the rectifying circuits illustrated in any figure may include more components that those illustrated in the figure, only the components illustrated in the figure or substantially only the components illustrate din the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A radiation sensor, comprising:
   multiple semiconductor regions that form a sensing PN junction and a draining PN junction that is located below the sensing PN junction;
   a bias circuit that is configured to (i) bias the sensing PN junction to maintain a sensing PN junction depletion region of a fixed size during a first sensing period and during a second sensing period, and (i) bias the draining PN junction to form a draining PN junction depletion region of a first size during the first sensing period and of a second size during the second sensing period; wherein the first size differs from the second size; and
   an output circuit that is configured to generate a first output signal that represent sensed radiation out of radiation that impinged on the radiation sensor during the first sensing period, and to generate a second output signal that represent sensed radiation out of radiation impinged on the radiation sensor during the second sensing period.

2. The radiation sensor according to claim 1 wherein the sensing PN junction depletion region and the draining PN junction depletion region are formed within a same semiconductor region of the multiple semiconductor region.

3. The radiation sensor according to claim 2 wherein at least a part of the sensing PN junction depletion region is positioned above at least a corresponding part of the draining PN junction depletion region.

4. The radiation sensor according to claim 1 wherein a sensitivity of the radiation sensor to radiation of a first wavelength is a function of a size of the sensing PN junction depletion region; and wherein a sensitivity of the radiation sensor to radiation of a second wavelength is a function of a size of the draining PN junction depletion region.

5. The radiation sensor according to claim 4 wherein the first wavelength and the second wavelength are different ultraviolet wavelengths.

6. The radiation sensor according to claim 1 wherein the output circuit comprises a capacitive transimpedance amplifier.

7. The radiation sensor according to claim 6, wherein the capacitive transimpedance amplifier comprises an operational amplifier, a switch and a capacitor; wherein the operational amplifier comprises an non-inverting input port, an inverting input port and an output port; wherein each one of the capacitor and the switch are coupled between the inverting input port and the output port; wherein the non-inverting input port is biased with a fixed bias signal; and wherein the inverting input port is also coupled to a first semiconductor region of the multiple semiconductor regions.

8. The radiation sensor according to claim 1 wherein the multiple semiconductor regions comprise a first semiconductor region of an N-type, a second semiconductor region of a P-type, and a third semiconductor region of an N-type, wherein the sensing PN junction is formed between the first semiconductor region and the second semiconductor region, and wherein the draining PN junction is formed between the second semiconductor region and the third semiconductor region.

9. A method for sensing radiation, the method comprises:
receiving radiation by a radiation sensor during multiple sensing periods; wherein the radiation sensor comprises (a) multiple semiconductor regions that form a sensing PN junction and a draining PN junction that is located below the sensing PN junction, (b) a biasing circuit, and an output circuit;
biasing, by the bias circuit and during the multiple sensing periods, the sensing PN junction to maintain a sensing PN junction depletion region of a fixed size during each sensing period; wherein the biasing comprises changing a biasing between one sensing period to another sensing period to provide a draining PN junction depletion region of different sizes during different sensing periods of the multiple sensing periods; and
generating, by the output circuit, multiple output signals indicative of the radiation received during the multiple sensing periods.

10. The method according to claim 9 wherein the sensing PN junction depletion region and the draining PN junction depletion region are formed within a same semiconductor region of the multiple semiconductor region.

11. The method according to claim 10 wherein at least a part of the sensing PN junction depletion region is positioned above at least a corresponding part of the draining PN junction depletion region.

12. The method according to claim 9 wherein a sensitivity of the radiation sensor to radiation of a first wavelength is a function of a size of the sensing PN junction depletion region; and wherein a sensitivity of the radiation sensor to radiation of a second wavelength is a function of a size of the draining PN junction depletion region.

13. The method according to claim 12 wherein the first wavelength and the second wavelength are different ultraviolet wavelengths.

14. The method according to claim 9 wherein the output circuit comprises a capacitive transimpedance amplifier.

15. The method according to claim 14 wherein the capacitive transimpedance amplifier comprises an operational amplifier, a switch and a capacitor; wherein the operational amplifier comprises an non-inverting input port, an inverting input port and an output port; wherein each one of the capacitor and the switch are coupled between the inverting input port and the output port; wherein the non-inverting input port is biased with a fixed bias signal; and wherein the inverting input port is also coupled to a first semiconductor region of the multiple semiconductor regions.

16. The method according to claim 9 wherein the multiple semiconductor regions comprise a first semiconductor region of an N-type, a second semiconductor region of a P-type, and a third semiconductor region of an N-type, wherein the sensing PN junction is formed between the first semiconductor region and the second semiconductor region, and wherein the draining PN junction is formed between the second semiconductor region and the third semiconductor region.

* * * * *